United States Patent [19]
Dumke

[11] Patent Number: 6,011,695
[45] Date of Patent: Jan. 4, 2000

[54] EXTERNAL BUS INTERFACE PRINTED CIRCUIT BOARD ROUTING FOR A BALL GRID ARRAY INTEGRATED CIRCUIT PACKAGE

[75] Inventor: Paul E. Dumke, Rancho Cordova, Calif.

[73] Assignee: Intel Corporation, Santa Clara, Calif.

[21] Appl. No.: 09/184,624

[22] Filed: Nov. 2, 1998

[51] Int. Cl.[7] .................................................. H05K 7/02
[52] U.S. Cl. ......................... 361/777; 361/780; 174/261; 174/262
[58] Field of Search .................................. 361/768, 777, 361/780, 794; 257/786, 723, 728; 174/261, 262, 264, 255; 29/831, 832, 850, 852, 854; 365/51, 52, 63; 333/246, 247

[56] References Cited

U.S. PATENT DOCUMENTS

| 4,890,194 | 12/1989 | Derryberry et al. | 361/719 |
| 5,424,492 | 6/1995 | Petty et al. | 361/777 |
| 5,594,626 | 1/1997 | Rostoker et al. | 361/784 |
| 5,682,297 | 10/1997 | Silva | 361/777 |

*Primary Examiner*—Donald Sparks
*Assistant Examiner*—John B. Vigushin
*Attorney, Agent, or Firm*—Blakely, Sokoloff, Taylor & Zafman LLP

[57] ABSTRACT

A top surface of the substrate may have a two-dimensional array of contact pads that are adapted to be connected to a two-dimensional array of contacts of the integrated circuit package. The contact pads may be connected to a staggered array of vias by a plurality of routing traces located on the top surface of the substrate.

18 Claims, 1 Drawing Sheet

EXTERNAL BUS INTERFACE PRINTED CIRCUIT BOARD ROUTING FOR A BALL GRID ARRAY INTEGRATED CIRCUIT PACKAGE

BACKGROUND OF THE INVENTION

1. Field of the Invention

The present invention relates to a printed circuit board layout.

2. Background Information

Integrated circuits are typically assembled into packages that are soldered to a printed circuit board. The packages and printed circuit board may be part of an electrical system such as a computer.

The printed circuit board contains routing traces that interconnect a plurality of integrated circuit packages that are mounted to the board. The routing traces typically carry digital signals that are transmitted between the integrated circuits of the system.

Some integrated circuits have a relatively large number of input/output (I/O) pads. The large number of I/O pads require a larger number of routing traces. Some printed circuit boards require multiple layers of routing traces to accommodate all of the I/O for the system. Routing traces located within different layers are typically connected by vias formed in the board. Multiple layers and interconnecting vias increase the complexity and cost of constructing the circuit board.

The integrated circuit packages typically have leads that are soldered to corresponding contact pads of the printed circuit board. The leads of some integrated circuit packages are aligned in a pair of single rows that extend along opposite sides of the package. One type of dual row package is referred to as a TSOP package. The top surface of the printed circuit board typically contains routing traces that route the contact pads to a row(s) of vias located on each side of the package. Such an arrangement simplifies the routing of the printed circuit board but limits the I/O of the package.

There have been developed integrated circuit packages which have a two-dimensional array of contacts located along a bottom surface of the package. For example there have been developed integrated circuit packages which contain a two-dimensional array of external solder balls that are reflowed onto the printed circuit board. These types of packages are typically referred to as ball grid array (BGA) packages.

It is difficult to route a two-dimensional array of contacts, particularly the contacts located at the center of the array. Routing two-dimensional arrays typically requires multiple routing layers. Each routing layer increases the cost of producing the printed circuit board. It would be desirable to provide a printed circuit board layout that effectively routes a two-dimensional array of contacts to an array of vias that extends along one edge of the package similar to a via array(s) used with TSOP packages.

SUMMARY OF THE INVENTION

One embodiment of the present invention is a substrate that is attached to an integrated circuit package. A top surface of the substrate may have a two-dimensional array of contact pads that are adapted to be connected to a two-dimensional array of contacts of the integrated circuit package. The contact pads may be connected to a staggered array of vias by a plurality of routing traces located on the top surface of the substrate.

DETAILED DESCRIPTION

Figure 1:
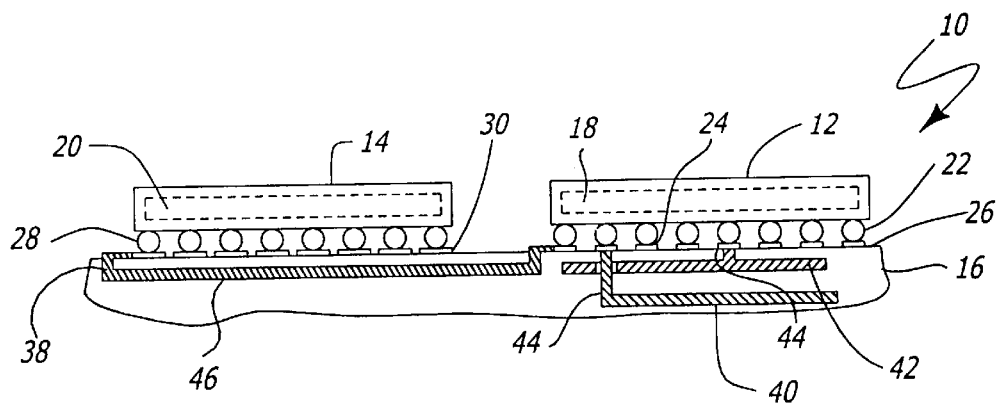
FIG. 1 is a side sectional view of an embodiment of an electrical assembly of the present invention.
Figure 2:
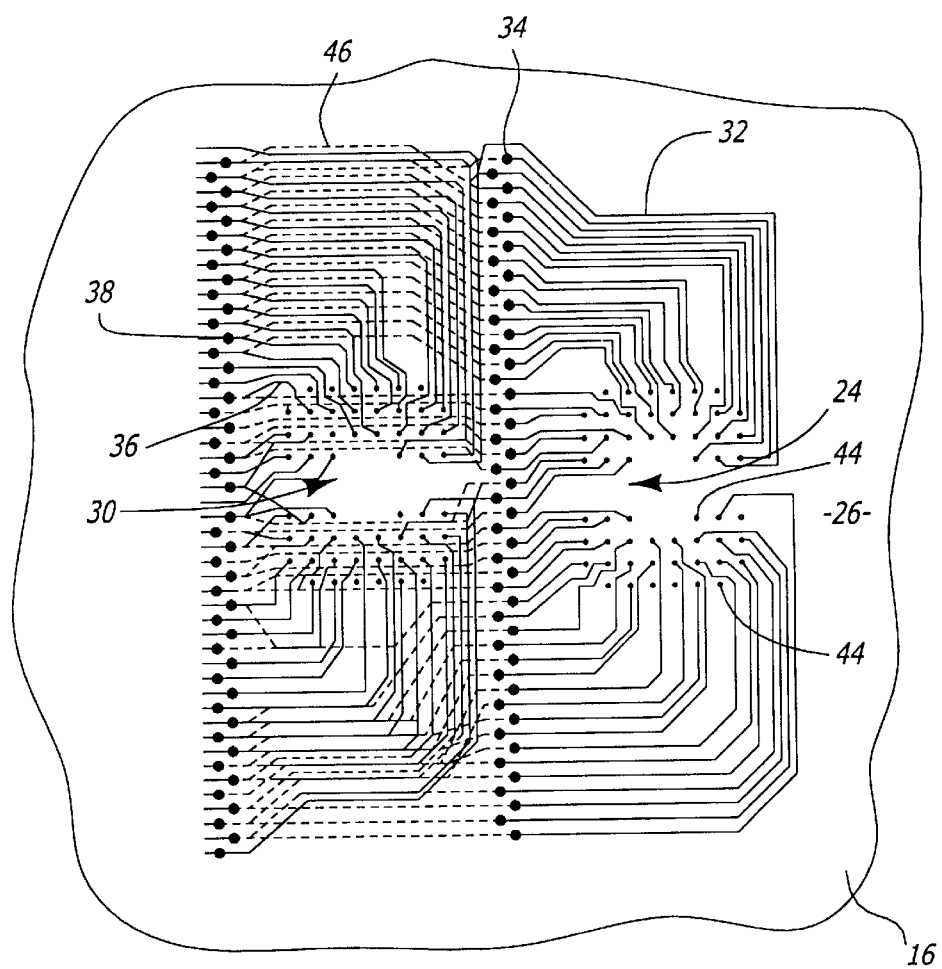
FIG. 2 is a top view of a substrate of the electrical assembly.

Referring to the drawings more particularly by reference numbers, FIGS. 1 and 2 show an embodiment of an electrical system 10 of the present invention. The system 10 may include a first integrated circuit package 12 and a second integrated circuit package 14 that are mounted to a substrate 16. The first integrated circuit package 12 may contain a first integrated circuit 18. The second integrated circuit package 14 may contain a second integrated circuit 20. The substrate 16 allows the integrated circuits 18 and 20 to communicate with each other. The substrate 16 may be a printed circuit board.

The first integrated circuit package 12 may have a two-dimensional array of first contacts 22 that are attached to a corresponding two-dimensional array of first contact pads 24 located on a top surface 26 of the substrate 16. Likewise, the second integrated circuit package 14 may have a two-dimensional array of second contacts 28 that are attached to a corresponding two-dimensional array of second contact pads 30 of the substrate 16. The contacts 22 and 28 may be solder balls that are reflowed onto the contact pads 24 and 30, respectively. Although solder balls are shown and described, it is to be understood that the packages 12 and 14 may have other types of contacts such as pins.

The substrate 16 may have a plurality of first routing traces 32 that extend along the top surface 26 and connect the first contact pads 24 to a staggered array of first vias 34. The first vias 34 may be arranged into two rows that are located along one side of the first integrated circuit package 12. The staggered arrangement allows routing traces 32 to be routed through adjacent vias 34 of the array.

The substrate 16 may also have a plurality of second routing traces 36 that extend along the top surface 26 and connect the second contact pads 30 to a staggered array of second vias 38. The second vias 38 may also be arranged into two rows that are located along one side of the second integrated circuit package 14. The first 32 and second 36 routing traces are typically dedicated to digital input/output (I/O) signals.

Some of the first 24 and second 30 contact pads may not be connected to the arrays of vias. These other contact pads 24 and 30 can be connected to internal power 40 and ground 42 planes of the substrate 16 by a second set of vias 44.

The substrate 16 may further have a plurality of internal routing traces 46 that are connected to the first 34 and second 38 vias. The internal routing traces 46 allow I/O signals to be transmitted between the integrated circuits 18 and 20. Arranging the first vias 34 along one side of the first package 12 simplifies the routing of the internal layer and minimizes the number of layers of the substrate 16. Additionally, placing the vias to one side of the package allows the second set of vias 44 to extend into the board without interfering with an internal routing layer. The array of second vias 38 provide termination points that can be easily routed to other integrated circuits (not shown) in the system. The present invention provides a substrate 16 that routes a two-dimensional array of contact pads to an array of vias located on only one side of an integrated circuit package similar to via arrays used for TSOP packages. This allows the remaining circuit board, connector, etc., to be routed independent of whether a TSOP or a two-dimensional BGA package(s) is mounted to the board.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A substrate, comprising:
   a substrate having a top surface which has a two-dimensional array of contact pads, said top surface of said substrate further having a staggered array of vias and a plurality of routing traces that connect all of said contact pads to said vias, said vias extend along one side of said two-dimensional array of contact pads.

2. The substrate of claim 1, wherein said two-dimensional array of contact pads are arranged in a rectangular pattern.

3. The substrate of claim 1, wherein some of said routing traces extend through pairs of adjacent vias within said staggered array of vias.

4. The substrate of claim 1, wherein said staggered array of vias are dedicated to input/output signals.

5. The substrate of claim 4, wherein said substrate includes a second set of vias that are connected to at least one of said contact pads.

6. The substrate of claim 5, wherein said second set of vias are connected to a power plane and a ground plane.

7. A substrate, comprising:
   a substrate having a top surface which has a two-dimensional array of first contact pads, said top surface of said substrate further having a staggered array of first vias and a plurality of first routing traces that connect said two-dimensional array of first contact pads to said first vias on said top surface, said top surface of said substrate also having a two-dimensional array of second contact pads, and a plurality of second routing traces that connect said two-dimensional array of second contact pads to a plurality of second vias, said substrate having a plurality of internal routing traces that connect said first vias to said second vias.

8. The substrate of claim 7, wherein said two-dimensional arrays of said first and second contact pads are each arranged in a rectangular pattern.

9. The substrate of claim 7, wherein said first vias extend along one side of said two-dimensional array of first contact pads.

10. The substrate of claim 7, wherein some of said first routing traces extend through pairs of adjacent first vias within said staggered array of first vias.

11. The substrate of claim 7, wherein said staggered array of first vias are dedicated to input/output signals.

12. The substrate of claim 11, wherein said substrate includes a second set of vias that are connected to at least one of said first contact pads.

13. The substrate of claim 12, wherein said second set of vias are connected to a power plane and a ground plane.

14. An electrical assembly, comprising:
   a substrate having a top surface which has a two-dimensional array of contact pads, said top surface of said substrate further having a staggered array of vias and a plurality of routing traces that connect all of said contact pads to said vias; and,
   an integrated circuit package which has a two-dimensional array of contacts that are attached to said two-dimensional array of contact pads, said vias extend along one side of said two-dimensional array of contact pads.

15. The substrate of claim 14, wherein said two-dimensional array of contact pads are arranged in a rectangular pattern.

16. The substrate of claim 14, wherein some of said routing traces extend through pairs of adjacent vias within said staggered array of vias.

17. The substrate of claim 14, wherein said staggered array of vias are dedicated to input/output signals.

18. The substrate of claim 17, wherein said substrate includes a second set of vias that are connected to at least one of said contact pads and to a power plane and a ground plane.

* * * * *